US006225858B1

(12) United States Patent
Guardiani et al.

(10) Patent No.: US 6,225,858 B1
(45) Date of Patent: May 1, 2001

(54) PERFORMANCE DRIVEN MULTI-VALUED VARIABLE SUPPLY VOLTAGE SCHEME FOR LOW POWER DESIGN OF VLSI CIRCUITS AND SYSTEMS

(75) Inventors: Carlo Guardiani, Mezzago; Roberta Burger Riccio, Vimodrone; Roberto Zafalon, Venezia; Andrea Veggetti, Cologno Monzese; Nicola Dragone, Brescia, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/473,897

(22) Filed: Dec. 28, 1999

(30) Foreign Application Priority Data

Dec. 29, 1998 (EP) .................................... 98830798

(51) Int. Cl.[7] ....................................................... G05F 1/10
(52) U.S. Cl. ........................... 327/544; 327/565; 364/489
(58) Field of Search ........................ 326/41, 47; 327/530, 327/534, 535, 544, 545, 564, 565, 566; 364/489, 491

(56) References Cited

U.S. PATENT DOCUMENTS 5,612,892    3/1997   Almulla ............................... 364/489

FOREIGN PATENT DOCUMENTS 5-299624    11/1993   (JP) .
9-270701    10/1997   (JP) .

OTHER PUBLICATIONS

Chang and Pedram, "Energy Minimization Using Multiple Supply Voltages," *IEEE Transactions on a Very Large Scale Integration (VLSI) Systems* 5(4):436–443, 1997.
Kuroda et al., "Variable Supply–Voltage Scheme for Low–Power High–Speed CMOS Digital Design," *IEEE Journal of Solid–State Circuits*, 33(3):454–461, Mar. 1998.
Usami and Horowitz, "Clustered Voltage Scaling Technique for Low–Power Design," Proceedings of the International Symposium on Low Power Design, pp. 3–8, Apr. 23, 1995.
Usami et al., "Automated Low–Power Technique Exploiting Multiple Supply Voltages Applied to a Media Processor," *IEEE Journal of Solid–State Circuits* 33(3):463–471, 1998.

*Primary Examiner*—Jeffrey Zweizig
(74) *Attorney, Agent, or Firm*—Theodore E. Galanthay; Robert Iannucci; Seed IP Law Group, PLLC

(57) ABSTRACT

A method of reducing power consumption of an electric circuit having a primary supply voltage and first and second circuit blocks is discussed. The method includes determining for the first circuit block an operation time for a first critical path of the first circuit block and determining for the second circuit block an operation time of a second critical path of the second circuit block. From those operation times, the method determines that the operation time of the first critical path is faster than the operation time of the second critical path. The method then creates a first supply voltage for the first circuit block that is less than the primary supply voltage in response to determining that the operation time of the first critical path is faster than the operation time of the second critical path.

16 Claims, 2 Drawing Sheets

PERFORMANCE DRIVEN MULTI-VALUED VARIABLE SUPPLY VOLTAGE SCHEME FOR LOW POWER DESIGN OF VLSI CIRCUITS AND SYSTEMS

TECHNICAL FIELD

The present invention relates to very large scale integrated (VLSI) circuit design, and more particularly, to a design method that reduces power consumption using plural supply voltage levels.

BACKGROUND OF THE INVENTION

One driving factor behind the push for low power design is the growing class of personal computing and communications devices that demand complex functions at high speed and low power to enable them to be supplied by existing power supplies. Another driving fact is that excessive power consumption has become a limiting factor in integrating more transistors on a single chip. Unless power consumption is dramatically reduced, the resulting heat will limit the feasible packing and performance of VLSI circuits and systems.

One method of reducing power consumption that has been recently proposed is to employ multiple supply voltages. The authors of Chang, J. M. and Pedram, M., "Energy Minimization Using Multiple Supply Voltages," IEEE Transactions on Very Large Scale Integration (VLSI) Systems, Vol. 5, No. 4, December 1997 ("Chang") describe a scheduling technique that assigns each operation in a data flow graph (DFG) to one of a fixed set of different supply voltages in order to minimize power consumption while meeting a predefined set of timing or throughput (for pipelined data paths) constraints. This technique starts from a high level description of the DFG and its output is a mapping of the optimized DFG onto a set of register transfer level (RTL) or data path operators (adders, multipliers, etc.) that have been previously characterized so as to get the power-timing tradeoff curves. In that sense the approach certainly belongs to the class of behavioral synthesis algorithms, and hence does not address the key issues of how to provide the multiple supply voltage rails on the chip with significantly penalizing the available routing resources.

A second approach is discussed in Kuroda, T. et al., "Variable Supply-Voltage Scheme for Low-Power High-Speed CMOS Digital Design," IEEE Journal of Solid-State Circuits, Vol. 33, No. 3, March 1998 ("Kuroda"). The approach in Kuroda is based on generating a mockup of the critical path of the design (actually two different replicas of the critical path, respectively 3% faster and slower). A built-in suite of test data are then transferred through the critical path mockups between register pairs that are clocked with the main clock of the system, and the output is compared with the output of a directly connected pair of registers. The result is used to feed a counter and eventually a voltage regulator that generates the supply voltage for the actual chip. Although the supply voltage is adaptively regulated to settle at its optimal (lowest) value $V_{DD}^*$ using a local feedback loop, only one supply voltage is employed. As a result, a large portion of the system may still be fed with a supply voltage in excess of that required for complete operation within a clock cycle.

A third approach is discussed in Usami, K et al., "Automated Low-Power Technique Exploiting Multiple Supply Voltages Applied to a Media Processor," IEEE Journal of Solid-State Circuits, Vol. 33, No. 3, March 1998 ("Usami"). The technique in Usami applies a multiple supply voltage scheme to the synthesis, placement, and routing of RTL blocks. The authors in Usami assume that two different levels of supply voltage are available on the chip: $V_{DD}^H$ and $V_{DD}^L$. During the technology mapping phase, each cell of a block is supplied at whichever one of the two different supply voltage levels minimizes the number of level shifters (required to convert from cells supplied with $V_{DD}^L$ to cells supplied with $V_{DD}^H$. As in Chang, this approach is geared toward the front end of the design process, and thus, must employ an oversimplified model of the timing and power consumed by the cells. Also, because cells within the same hierarchical block can be assigned to different supply voltages, routing resources are severely penalized because of the other tracks that are necessary to distribute the extra supply rail. In addition, only two different supply voltages ($V_{DD}^H$ and $V_{DD}^L$) are considered.

SUMMARY OF THE INVENTION

An embodiment of the invention is directed to a method of reducing power consumption of an electric circuit having a primary supply voltage and first and second circuit blocks. The method includes determining for the first circuit block an operation time for a first critical path of the first circuit block and determining for the second circuit block an operation time of a second critical path of the second circuit block. From those operation times, the method determines that the operation time of the first critical path is faster than the operation time of the second critical path. The method then creates a first supply voltage for the first circuit block that is less than the primary supply voltage in response to determining that the operation time of the first critical path is faster than the operation time of the second critical path.

An embodiment of the invention is also directed to an electric circuit being supplied by a primary supply voltage and comprising a first circuit block having a first critical path and a second circuit block having a second critical path supplied by the primary supplied voltage. The electric circuit also includes a voltage regulator having an input coupled to the primary supply voltage and an output coupled to the first circuit block, the voltage regulator being structured to produce at the output a first supply voltage from the primary supply voltage, the first supply voltage being at a level less than the primary supply voltage and at a level that drives the first circuit block such that the first critical path operates at a speed approximately equal to a speed in which the second critical path operates.

DETAILED DESCRIPTION

An embodiment of the invention is directed to a method for reducing the consumption of power in electric circuits, and an electric circuit resulting from that method. It is based on the fact that each independent circuit block into which an electronic circuit can be subdivided very often produces a velocity greater than that requested from the specifications.

As a result, the velocity of many individual circuit blocks can be reduced without compromising the specifications. The velocity of each individual circuit block can be reduced by lowering the supply voltage applied to the block, which reduces the amount of power consumed by the block and the circuit as a whole.

Figure 1:
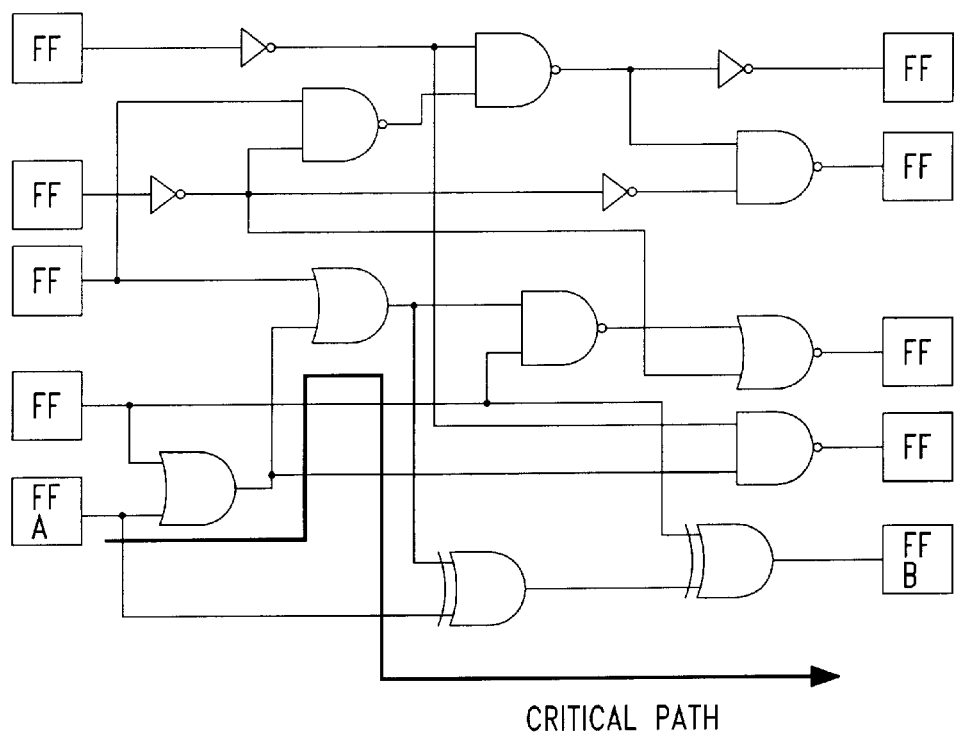
FIG. 1 is a logic block diagram of an electric circuit block with its critical path indicated.

Before discussing the details of the invention, it may be helpful to discuss in some detail one of the expressions that will be used in the discussion later: the "critical path" of a circuit block. In general, the "critical path" of a circuit block is the signal path that limits the speed of the circuit block, that is, the signal path through which signals take the longest time to traverse the circuit block. For example, FIG. 1 shows a critical path for an exemplary logical circuit block. As indicated, the critical path is the path from FF A through two OR gates and two exclusive-OR gates to FF B. No other signal path through the circuit block passes through four logical gates, and thus, it is likely that no other signal path would take as long as the indicated critical path to convey a signal through the logical circuit block. If the logic gates of another signal path were designed to be slower than the logic gates of the indicated critical path, then the other signal path would instead be the critical signal path.

Figure 2:
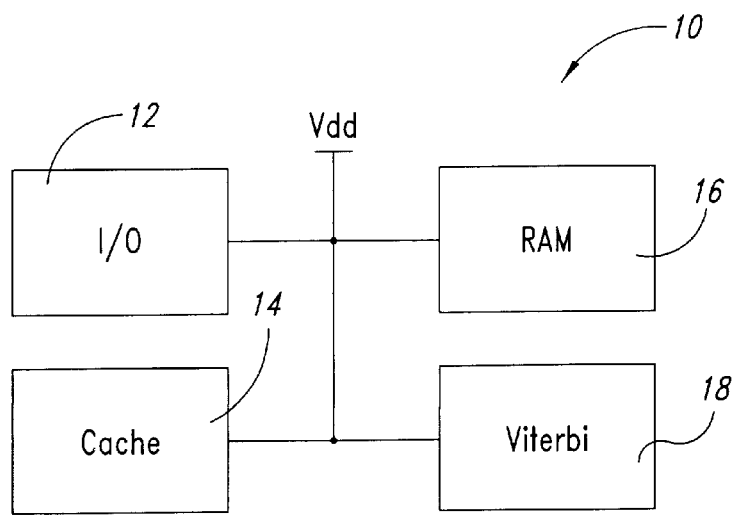
FIG. 2 is a block diagram of an electric circuit being supplied by a single supply voltage.

The method of one embodiment of the invention can perhaps best be appreciated with regard to an exemplary electric circuit 10, which is shown in block diagram form in FIG. 2. It will be appreciated that the electric circuit 10 is exemplary only and the method can be applied to numerous other electric circuits.

The electric circuit 10 is used for Viterbi decoding which is a well-known statistical scheme employed in contexts such as speech recognition that involve analysis of very large quantities of data. The electric circuit 10 includes an input/output (I/O) block 12 that inputs data into and outputs data from the electric circuit 10, a memory cache 14 that stores data for very fast access, a main memory unit (RAM) 16 that also stores data, and a Viterbi decoder 18. The Viterbi decoder 18 includes a processing unit (not shown) that executes Viterbi decoding on data input by the I/O block 12 and stored in the Cache 14 or the RAM 16. It will be understood that the details of the operation of the electric circuit 10 are not needed in order to understand and practice the invention.

The entire electric circuit 10 is designed according to normal design procedures, without regard for the power conservation techniques of the present invention, to satisfy preestablished product specifications. A temporal analysis is then performed on the electric circuit 10 to determine an operation time for the critical path of each of the circuit blocks 12–18. Such a temporal analysis can employ traditional static timing analysis and commercial circuit analysis tools such as Primetime$^{tm}$ and Designtime$^{tm}$ from Synopsis, Inc.

Figure 3:
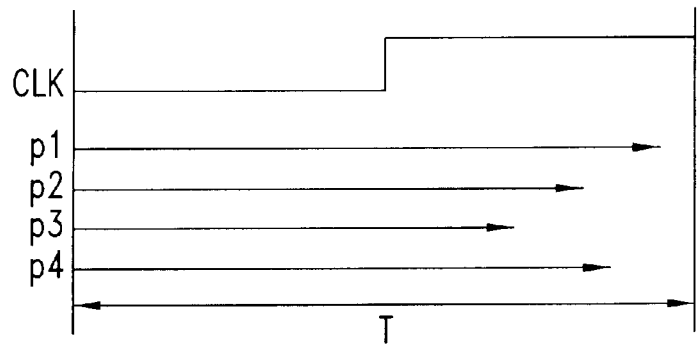
FIG. 3 is a timing diagram showing the operation times of the electric circuit shown in FIG. 2.

The temporal analysis can result in raw timing data and/or a timing diagram such as is shown in FIG. 3. The timing diagram of FIG. 3 shows one clock (CLK) period and relative operation times for the I/O block 12 (p1), the cache 14 (p2), the RAM 16 (p3), and the Viterbi block 18 (p4). As can be seen from FIG. 3, the longest operation time for the critical paths of the circuit blocks 12–18 of FIG. 2 is that of the I/O block 12 (p1). As a result, the critical path of the I/O block 12 is referred to as the principal critical path of the electric circuit 10 because it is the critical path that determines whether the electric circuit operates within the speed constraints of the specifications.

The electric circuit 10 operates within the speed constrains of the specifications as long as the circuit block that includes the principle critical path operates with positive slack timing. The I/O block 12, which includes the principle critical path of the electric circuit 10, has slack timing of T−tp1, where T is the clock (CLK) period and tp1 is the operation time of the principle critical path. If T−tp1>0, then there is a margin, that is, all of the blocks function at a speed greater than that requested. If T−tp1<0, then there is no margin, that is, the circuit should be redesigned because it does not satisfy the specifications.

Based on the temporal analysis performed on the electric circuit 10, the electric circuit is adjusted by reducing the supply voltages of the circuit blocks whose critical paths operate faster than the principle critical path. In addition, the supply voltage of the circuit block that includes the principle critical path could also if the slack timing of that circuit block is positive, that is, if there is margin for the circuit block. Alternatively, the clock period for the electric circuit could be reduced to the speed of the principle critical path as long as other electric circuits are not relying on that clock period.

Figure 4:
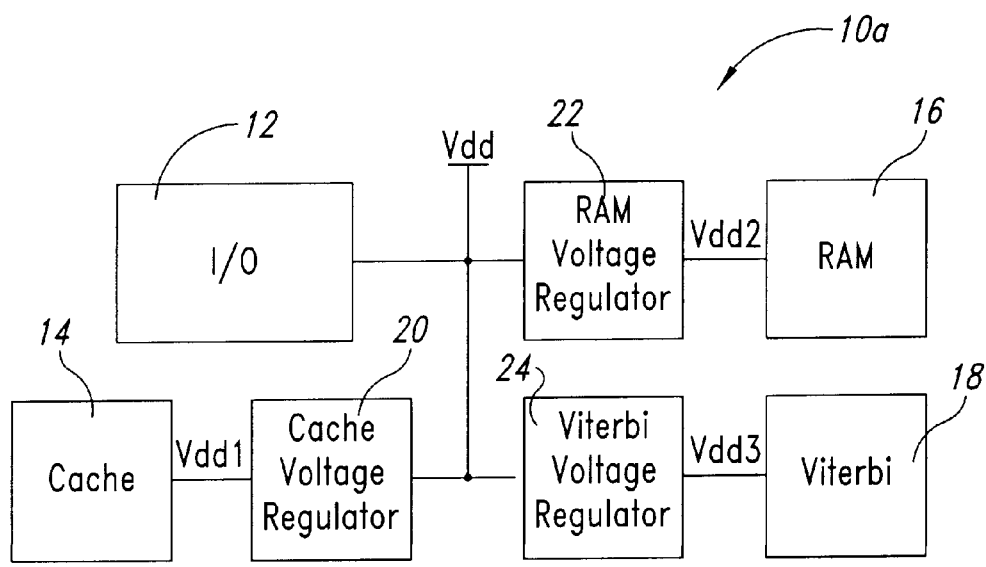
FIG. 4 is a block diagram of the electric circuit of FIG. 2 as modified according to an embodiment of the present invention.

In the electric circuit 10, the principal critical path is in the I/O block 12, so the supply voltages for the cache 14, RAM 16, and Viterbi block 18 are lowered, while the supply voltage for the I/O block 12 remains unchanged in one embodiment. As shown in FIG. 4, a cache voltage regulator 20, RAM voltage regulator 22, and Viterbi voltage regulator 24 are added to the electric circuit 10 to produce an electric circuit 10A according to an embodiment of the invention. Each of the voltage regulators 20–24 includes an input coupled to the principal supply voltage Vdd and produces at an output a regulated voltage less than Vdd. In particular the cache voltage regulator 20, RAM voltage regulator 22, and Viterbi voltage regulator 24 produce regulated supply voltages of Vdd1, Vdd2, and Vdd3, respectively. An I/O voltage regulator could also be employed to provide to the I/O block 12 a regulated supply voltage equal to or less than the principal supply voltage Vdd.

In one embodiment, the supply voltages Vdd1, Vdd2, and Vdd3 are set at levels low enough so that the critical paths of the respective circuit blocks 14, 16, 18 are slowed to a speed approximately equal to the speed of the principal critical path. As can be seen from the timing diagram of FIG. 3, the RAM 16 had the fastest critical path (p3), followed by the cache 14 critical path (p2) and the critical path (p4) of the Viterbi block 18. As a result, the supply voltage Vdd2 for the RAM 16 will be set at the lowest level followed in ascending order by the supply voltage Vdd1 for the cache 14 and the supply voltage Vdd3 for the Viterbi block 18 in order to equalize the operation times of the circuit blocks 14–18 with that of the I/O block 12. Of course, the operation times of the critical paths of all of the circuit blocks are not required to equal the operation time of the principal critical path, but such equalization maximizes the power savings without reducing the overall speed of the electric circuit 10.

It will be appreciated that it is a simple matter to determine the best values for the regulated supply voltages Vdd1, Vdd2, and Vdd3 and to produce the appropriate voltage regulators 20–24 that provide those regulated supply voltages. The supply voltage for each circuit block can simply be reduced manually (using a variable power supply) until the commercial circuit analysis tools being employed shows that the operation time for the critical path of the circuit block has reached the operation time of the principal critical path. After the respective supply voltage values are determined, the variable power supply can be replaced by any of numerous well-known and/or commercial voltage regulators to implement the voltage regulators 20–24 of the electric circuit 10A shown in FIG. 4.

Employing plural supply voltages in an electric circuit may require that voltage level shifters be employed to interface a circuit block powered by a relatively low supply voltage to a circuit block powered by a relatively high supply voltage. Such level shifters do add somewhat to the size of the electric circuit and also dissipate some power, but the inventors have found that employing plural supply voltages at reduced levels more than compensates for the penalties incurred by employing level shifters.

By analyzing the speed of each circuit block after the circuit block has already been designed to satisfy the circuit specifications and then reducing the supply voltage for the circuit block based on that analysis, the embodiment of the present invention provides a much simpler and more effective power conservation method than those discussed in the prior art. The prior art schemes either attempt the very complicated, and probably infeasible, task of adjusting the supply voltages from the beginning of the design stage or simply try to employ a single supply voltage level that may be optimum for one supply voltage, but leave many portions of the circuit operating at higher than necessary voltage levels. Moreover, the present invention enables the power consumption to be substantially reduced without reducing the overall speed of the circuit.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of reducing power consumption of an electric circuit having a primary supply voltage and first and second circuit blocks, comprising:
    determining for the first circuit block an operation time for a first critical path of the first circuit block;
    determining for the second circuit block an operation time of a second critical path of the second circuit block;
    determining that the operation time of the first critical path is faster than the operation time of the second critical path; and
    creating a first supply voltage for the first circuit block that is less than the primary supply voltage in response to determining that the operation time of the first critical path is faster than the operation time of the second critical path.

2. The method of claim 1 wherein the act of creating includes setting the first supply voltage at a value that is less than the primary supply voltage by an amount based on how much faster the operation time of the first critical path is compared to the operation time of the second critical path.

3. The method of claim 1, further comprising:
    determining for a third circuit block of the electric circuit an operation time of a third critical path of the third circuit block;
    determining that the operation time of the third critical path is faster than the operation time of the second critical path; and
    creating a second supply voltage for the third circuit block that is less than the primary supply voltage in response to determining that the operation time of the third critical path is faster than the operation time of the second critical path.

4. The method of claim 3 wherein the act of creating the first supply voltage includes setting the first supply voltage at a value that is less than the primary supply voltage by an amount based on how much faster the operation time of the first critical path is compared to the operation time of the second critical path and the act of creating the second supply voltage includes setting the second supply voltage at a value that is less than the primary supply voltage by an amount based on how much faster the operation time of the third critical path is compared to the operation time of the second critical path, the second supply voltage being less than the first supply voltage if the operation time of the third critical path is faster than the operation time of the first critical path.

5. The method of claim 3 wherein the second supply voltage is made less than the first supply voltage if the operation time of the third critical path is faster than the operation time of the first critical path.

6. The method of claim 1, further comprising supplying the primary supply voltage to the second circuit block.

7. The method of claim 1, further comprising employing the first supply voltage in the first critical path.

8. The method of claim 1 wherein the creating act includes creating the first supply voltage from the primary supply voltage.

9. A method of reducing power consumption of an electric circuit having a primary supply voltage and first and second circuit blocks, comprising:
    determining that an operation time of a first critical path of the first circuit block is faster than an operation time of a second critical path of the second circuit block;
    supplying the second critical path with the primary supply voltage;
    creating a first supply voltage for the first circuit block that is less than the primary supply voltage in response to determining that the operation time of the first critical path is faster than the operation time of the second critical path; and
    supply the first critical path with the first supply voltage.

10. The method of claim 9 wherein the act of creating includes setting the first supply voltage at a value that is less than the primary supply voltage by an amount based on how much faster the operation time of the first critical path is compared to the operation time of the second critical path.

11. The method of claim 9, further comprising:
    determining for a third circuit block of the electric circuit an operation time of a third critical path of the third circuit block;
    determining that an operation time of a third critical path of a third circuit block of the electric circuit is faster than the operation time of the second critical path; and
    creating a second supply voltage for the third circuit block that is less than the primary supply voltage in response to determining that the operation time of the third critical path is faster than the operation time of the second critical path.

12. The method of claim 11 wherein the act of creating the first supply voltage includes setting the first supply voltage at a value that is less than the primary supply voltage by an amount based on how much faster the operation time of the first critical path is compared to the operation time of the second critical path and the act of creating the second supply voltage includes setting the second supply voltage at a value that is less than the primary supply voltage by an amount based on how much faster the operation time of the third critical path is compared to the operation time of the second critical path, the second supply voltage being less than the first supply voltage if the operation time of the third critical path is faster than the operation time of the first critical path.

13. The method of claim 11 wherein the second supply voltage is made less than the first supply voltage if the operation time of the third critical path is faster than the operation time of the first critical path.

14. The method of claim 9 wherein the creating act includes creating the first supply voltage from the primary supply voltage.

15. The method of claim 9, further comprising determining the operation times for the first and second critical paths.

16. An electric circuit being supplied by a primary supply voltage, comprising:

a first circuit block having a first critical path;

a second circuit block having a second critical path supplied by the primary supplied voltage; and a voltage regulator having an input coupled to the primary supply voltage and an output coupled to the first circuit block, the voltage regulator being structured to produce at the output a first supply voltage from the primary supply voltage, the first supply voltage being at a level less than the primary supply voltage and at a level that drives the first circuit block such that the first critical path operates at a speed approximately equal to a speed in which the second critical path operates.

* * * * *